(12) United States Patent
Kim et al.

(10) Patent No.: US 6,313,644 B1
(45) Date of Patent: Nov. 6, 2001

(54) APPARATUS AND METHOD FOR MEASURING VOLTAGE STANDING WAVE RATIO IN ANTENNA OF BASE STATION

(75) Inventors: Young Min Kim, Seoul; Bo Jong Kim; Dae Won Kim, both of Kunpo, all of (KR)

(73) Assignee: LG Information & Communications, Ltd., Seoul (KR)

( * ) Notice: Subject to any disclaimer, the term of this patent is extended or adjusted under 35 U.S.C. 154(b) by 0 days.

(21) Appl. No.: 09/112,012

(22) Filed: Jul. 8, 1998

(30) Foreign Application Priority Data

Jul. 10, 1997 (KR) .................................................. 97-32092

(51) Int. Cl.⁷ .................................................. G01R 27/06
(52) U.S. Cl. ........................... 324/645; 324/642; 324/646
(58) Field of Search .................................... 324/637, 642, 324/645, 646, 647

(56) References Cited

U.S. PATENT DOCUMENTS

| | | | |
|---|---|---|---|
| 4,110,685 | * | 8/1978 | Leenerts .............................. 324/646 |
| 4,580,092 | * | 4/1986 | Squire ................................. 324/646 |
| 5,408,690 | * | 4/1995 | Ishikawa et al. ................ 324/646 X |
| 5,507,010 | * | 4/1996 | Ahonen ........................... 324/645 X |

\* cited by examiner

*Primary Examiner*—Glenn W. Brown
(74) *Attorney, Agent, or Firm*—Fleshner & Kim, LLP

(57) ABSTRACT

An apparatus for measuring a voltage standing wave ratio of a base station. The apparatus comprises: a unit for measuring the voltage standing wave ratio of a transmitting terminal by coupling an input signal from the base station, and by comparing the difference of the coupled signal and a signal reflected from a transmitting antenna; and another unit for measuring the voltage standing wave ratio of a receiving terminal by comparing an input signal from a base-station test unit with the signal reflected from a receiving terminal.

43 Claims, 6 Drawing Sheets

APPARATUS AND METHOD FOR MEASURING VOLTAGE STANDING WAVE RATIO IN ANTENNA OF BASE STATION

BACKGROUND OF THE INVENTION

1. Field of the Invention

The present invention relates to an apparatus and a method for measuring a voltage standing wave ratio of an antenna of a base station, and more particularly to the apparatus and method for measuring the voltage standing wave ratio of a transferring terminal TX and a receiving terminal RX of the base station of a mobile communication, by using a base-station test unit for checking and testing the base station of the mobile communication.

2. Discussion of Related Art

In general, in the mobile communication system, it is an ideal that transmission output from the base station radiates in the air through a transmitting antenna. But the location of each base station, the surroundings and equipment installation conditions are different from each other, even though the same equipment is used, the efficiency in the transmission and reception of the base station is affected by the surroundings.

Thus, in order to make the base station perform at an optimal state, the state of the base station should be controlled in accordance with conditions around the base station and to minimize the minimize the effects of conditions by continuously monitoring the state of the base station.

The voltage standing wave ratio is used to check the state of the base station.

The standing wave is also called a stationary wave, which is generated by the combination of an incident wave from the signal source on the transmission line, and a reflected wave from the receiving terminal. The standing wave has a constant ratio of an order value between points of "A" and "B", regardless of time, and ordinarily there are a lot of cases in which the amplitude of variation in the transmission is of the periodic function of the distance to the wave length direction.

Also, the standing wave ratio is of the amplitude to both anti node and wave node. If reflection coefficient is "τ", the SWR is defined as (1+τ)/(1−τ). Particularly, the SWR to a voltage is named VSWR, which is the ratio of the amplitude of voltage at the maximum point of the voltage caused around the waveguide, coaxial cable and transmission line at the minimum point adjacent thereto.

Accordingly, by measuring the SWR, each base station can check if the transmitting signals are efficiently well transmitted through an antenna connected to its transmission terminal. That is, it is determined whether the antenna and the transmission source are properly and efficiently matched. This means that each base station has to measure the above VSWR consistently and periodically.

In general, the large VSWR means that the transmission output at the base station doesn't radiate in the air, but returns to a transmission outlet of the system as much as the amount of mis-matching and has a bad effect on its transmission outlet.

Namely, the mismatching means that VSWR is so large that the quality and effectiveness of the system equipment is substantially degraded. Therefore, by measuring VSWR, the efficiency can be determined. Accordingly, each base station can control the loss of transmission in order to make good electrical matching between the different mediums and to make it possible to send voltage without any loss.

Also, even in case there is something wrong with a cable and antenna by the change of surrounding nearby, it triggers the big change of the VSWR so that each station can control its condition in a remote way.

The coupler is widely used as a tool for measuring the VSWR, which consists of an input terminal, a coupling terminal, an isolation terminal, and an output terminal.

The coupling terminal is where the signal inputted to the input terminal is outputted, after being attenuated as much as a fixed coupling coefficient C. The isolation terminal is where the signal inputted to the input terminal is theoretically held completely. But, in reality, there happens to be a little leaking named the isolation coefficient I. Also, the input terminal of the coupling can be used as an output terminal, which means the coupling terminal and the isolation terminal exchange their role. Namely, the terminal for generating an input signal from the input terminal is the coupling terminal and the opposite one to prevent output is the isolation terminal. The difference between the coupling coefficient C and the isolation coefficient is marked "D".

So, the output terminal is where the signals inputted to the input terminal are generated, namely, the transmission signals are generated and decreased as much as the coupling coefficient of the coupling terminal and the isolation coefficient of the isolation terminal. For example, if the coupling coefficient is 30 dB and the isolation is perfect, 99.9% of the signals in the input terminal is transmitted. Namely, the coupling coefficient of 30 dB is $\frac{1}{1000}$, about 0.1%, which means that 0.1% of the entire transmitted signals are generated to the coupling terminal and 99.9% is generated to the output terminal without any leak into the isolation terminal.

The equipment to measure VSWR of the output and input terminals at each base station according to the prior art will be explained in FIG. 1.

The VSWR measuring equipment 15 of the prior art has a cellular or PCS station system 1, a transmission coupler 10 having an input terminal 11, a coupling terminal 12, an isolation terminal 13, and an output terminal 14 connected to the transmitting terminal of the base station 1, a transmission voltage standing wave ratio 15 for measuring the voltage standing wave ratio of the transmitting terminal under connection to the coupling terminal 12 and the isolation terminal 13 of the transmission coupler 10, and a transmitting antenna 16 connected to an output terminal of the transmission coupler 10.

Also, as the combination of the VSWR measuring equipment 23 of the reception terminal, the reception coupler 20 connected with the reception terminal of the above station has the following 5 terminals, namely the input terminal 24, a first coupling terminal 25, a second coupling terminal 26, an output terminal 27, and isolation terminals 28. The first coupling terminal 25 of the reception coupler 20 is coupled with the Phase Locked Loop 21, the second coupling terminal 26 of the reception coupler 20 with the voltage standing wave ratio 23 of the receiving terminal, respectively.The input terminal 24 of the reception coupler 20 is coupled with the receiving antenna 22, the output terminal 27 of the reception coupler 20 with the receiving terminal of the base station 1, and the isolation terminal 28 with the voltage standing wave ratio 23 of the receiving terminal, respectively.

There will be explained an operation of the antenna of the base station VSWR measurement equipment as follows.

First, the measuring procedure of the VSWR on the transmission terminal is fully explained. The signal from the output terminal of the station system 1 is transmitted to the input terminal 11 of the transmitting coupler 10, diminishes as much as coupling coefficient C and becomes an output X1, which is transmitted to the SWR measuring equipment 15 of the reception terminal.

Also, the signal of the above station inputted to the above transmitting coupler 10 is transmitted to the transmitting antenna 16 through the output terminal 14. But, if the transmission terminal and transmitting antenna 16 of the base station 1 are not fully matched, all the signals transmitted to the above transmission antenna 16 will not radiate to the air and some transmitted signals are reflected due to the mis-matching. This reflected signal is applied to the output terminal 14 of the transmission coupler 10 and becomes the output X2 through the isolation terminal 13 of the above transmission coupler 10 to thereby be applied to the transmission terminal VSWR equipments 15 which measure the ratio of the VSWR of the transmission terminal coupler comparing the values of outputs X1 and X2.

There will be explained hereinafter a measuring procedure of the VSWR of the reception terminal.

First, an oscillator having PLL 21 connected to the first coupling terminal 25 of the reception coupler 20 oscillates some frequency either from Frequency Band of the reception frequency of the above station system with some power. The first coupling terminal 25 of the reception coupler 20 having the oscillated frequency, generates a transmission signal X4 reduced as much as the couple coefficient C by the second coupling terminal 26. And, the rest of non-reduced signals are generated to the receiving antenna 22.

The receiving antenna 22 reflects signal due to the mismatch with the reception part of the above station. The reflected signals generate the transmission signal X3 reduced by the couple coefficient C of the isolation terminal 28 of the reception coupler 20. Also, the VSWR equipment 23 of the reception terminal will measure the ratio of the VSWR of the reception terminal by comparing the outputs X3 and X4.

As mentioned above, the part of the previous reception terminal can't measure the VSWR in the same manner with that of the output terminal because it is not where signal is generated but where the signal is inputted. Accordingly, the receiving part generates some random signals and sends them to the receiving antenna, after it measures the output X3 reflected from the receiving antenna 22 and calculates the ratio of the VSWR through the output X4 coupled with the above PLL 21 signals. At this time, the equipment to measure the VSWR on the receiver's side was quite complicated because the oscillator with the PLL was widely used to generates signals.

In other words, in measuring VSWR according to the prior art, there has been a big problem that an exclusive VSWR equipment only for measuring the VSWR and exclusive oscillator with the PLL and the reception coupler separately manufactured to measure the VSWR of the reception terminal become larger.

Furthermore, when measuring the VSWR of the reception part, there has been a problem that noise caused by the PLL oscillator or mixer could affect the precision of measurement of the VSWR ratio.

And, the PLL signal is applied to the first coupling terminal 25, and after reduced in accordance with the couple coefficient C of second coupling terminal 26 and reflected as much as mis-matching at the receiving antenna 22. And also reduced in accordance with the couple coefficient C of isolation terminal 28 after that inputted to reception terminal of the base station 1. Therefore the base station cannot discern the above PLL signal from the signal received by the ordinary user's terminals, because the signal reduced again as much as the couple coefficient C of the isolation terminal is directly inputted to the above reception terminal of the base station. Accordingly, the operation of the reception terminal had a problem that it had to be stopped until the VSWR measuring is finished, which caused the entire base station system to be held up by the end of the VSWR measurement.

Also, when manufacturing the reception coupler 20, except the coupling terminal and the isolation terminal, another coupling port to receive a signal of the random PLL circuit is needed. In general, it is more difficult for a coupler with three coupling ports to match each port's function than a coupler with two coupling ports. Also, there is a problem in that it is difficult to manufacture the system and its manufacturing cost rises. Further, there is provided a problem that it is difficult to measure the accurate characteristic of the voltage standing wave ratio owing to an operation of the oscillator.

SUMMARY OF THE INVENTION

Therefore, an object of the present invention is to provide an apparatus and method for measuring a voltage standing wave ratio of an antenna in a base station, which is capable maintaining basic functions of a transmitting/receiving system of the base station, and of measuring the voltage standing wave ratio of the antenna therein without cutting communication between the terminals thereof.

The other object of the present invention is to provide an apparatus and method for measuring the voltage standing wave ratio of the antenna in the base station under use of a base-station test unit capable of measuring the characteristic of the accurate voltage standing wave ratio without noise.

Another object of the present invention is to provide an apparatus and method for measuring the voltage standing wave ratio of the base station, which is more simple and less expensive than the conventional apparatus and method for measuring the voltage standing wave ratio of the base station.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve the above objects in accordance with the present invention, as embodied and broadly described, the apparatus for measuring the voltage standing wave ratio of the base station comprises: a unit for measuring the voltage standing wave ratio of a transmitting terminal by coupling an input signal from the base station, and by comparing the difference of the coupled input signal and a signal reflected from a transmitting antenna; and another unit for measuring the voltage standing wave ratio of a receiving terminal by comparing an input signal from a base-station test unit with the signal reflected from a receiving terminal.

Further, to achieve the above objects in accordance with the present invention, as embodied and broadly described, the method for measuring the voltage standing wave ratio of the base station comprises: measuring the voltage standing wave ratio of a transmitting terminal by comparing the difference between a signal coupled by an input signal from the base station and a signal reflected from a transmitting antenna; and obtaining the voltage standing wave ratio of a receiving terminal by comparing the difference between an input signal from a base-station test unit and the signal reflected from a receiving antenna.

The apparatus and method for measuring the voltage standing wave ratio can selectively use a voltage standing wave ratio unit of a receiving terminal or a transmitting terminal, if necessary.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

DETAILED DESCRIPTION OF PREFERRED EMBODIMENT

Reference will now be made in detail to the preferred embodiments of the present invention, examples of which are illustrated in the accompanying drawings.

Figure 1:
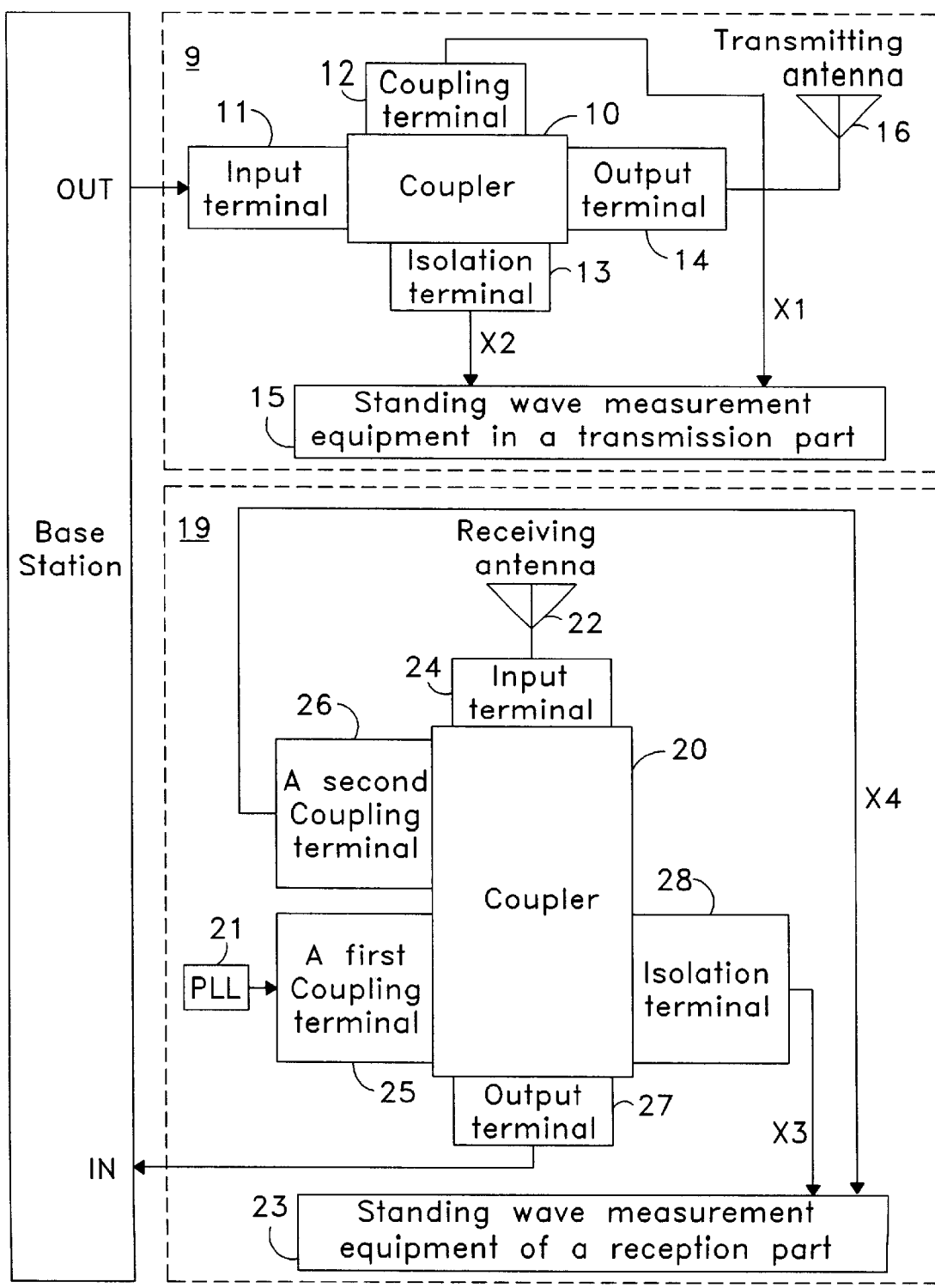
FIG. 1 is a construction view of a voltage standing wave ratio measurement apparatus of an antenna in a base station according to the prior art.
Figure 2:
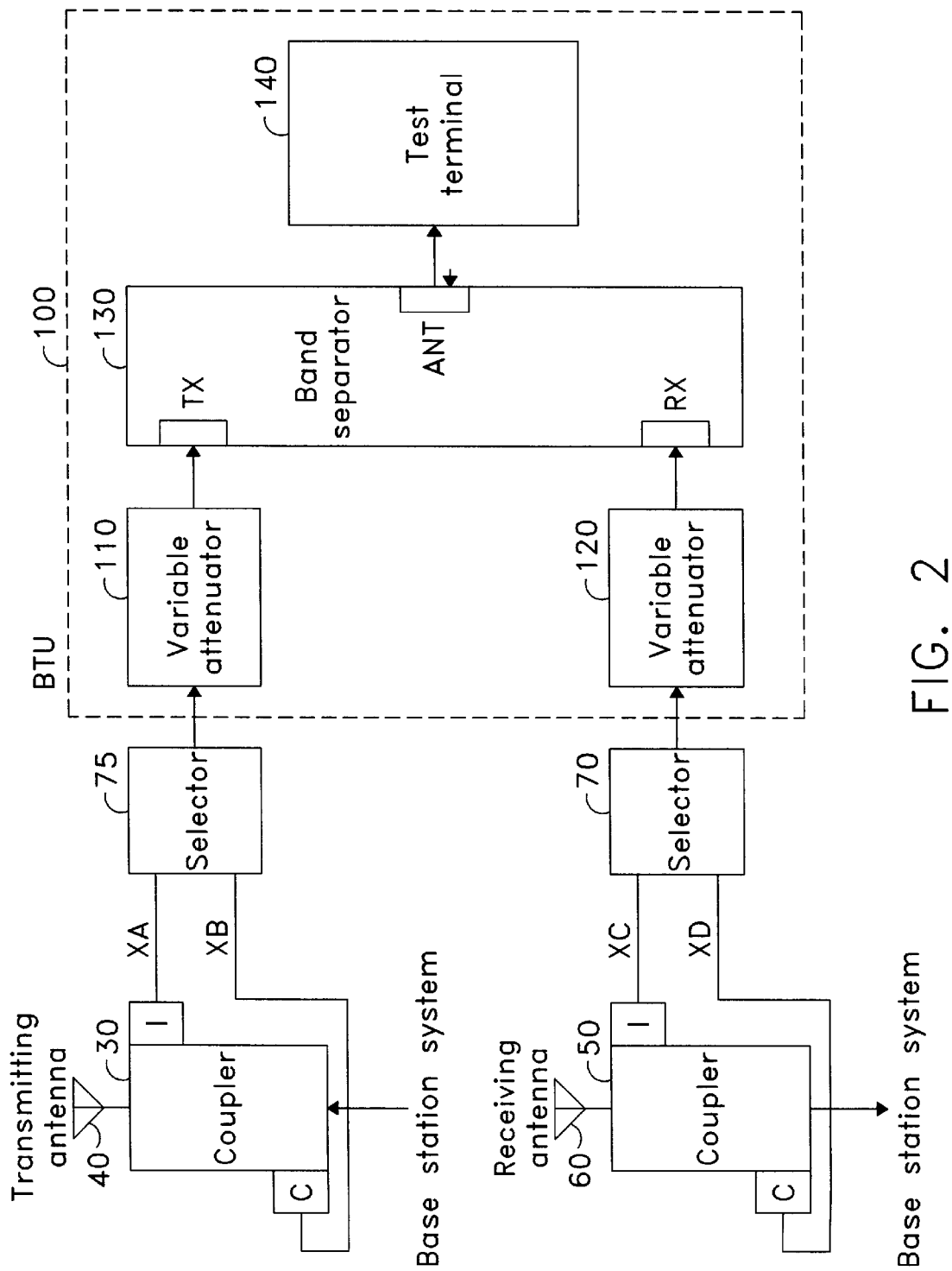
FIG. 2 is a construction view of a voltage standing wave ratio measurement apparatus of an antenna in a base station according to the present invention.

FIG. 2 is a construction view of a voltage standing wave ratio measurement apparatus of an antenna in a base station according to the present invention.

Referring to FIG. 2, there are provided a transmission coupler 30, a transmission selector 75, a base station test unit 100 having transmitting variable attenuator 110, band separator 130, test terminal 140, receiving variable attenuator 120, a reception selector 70, and a reception coupler 50. The transmission coupler 30 generates a direct path signal XB obtained by directly coupling an output signal by a coupling coefficient C in a coupling terminal, the output signal being applied from the base station. Also, the transmission coupler 30 generates a reflection signal XA coupled by the coupling coefficient C of an isolating terminal, the reflection signal being reflected from the transmission antenna. The transmission selector 75 selects any one of the direct and reflection paths of the transmission coupler 30. The variable attenuator 110 attenuates both of a signal of the direct path XB and a signal of the reflection path XA in a proper level to its measurement. The band separator 130 separates a transmission signal from a reception signal. The reception variable attenuator 120 attenuates a transmission output of the test terminal 140 in the proper level, and consists of a variable reception attenuator. The reception selector 70 selects any one of the direct path XD and an indirect path XC to apply a signal of the variable attenuator 120 of the base-station test unit 100 to a selected path. The reception coupler 50 is provided with the direct path signal XD from the selector 70 to directly output the signal to a receiving terminal of the base station system 1. Also the reception coupler 50 is provided with the indirect path signal from the selector 70 to thereby apply a signal reflected in the antenna 60 to a receiving terminal of the base station system 1, the coupler 50 being connected to the reception antenna 60.

In the above construction, as a sort of an unmanned base station checking system, the base-station test unit can perform the various tests of the base station. That is, as the number of the base station is increased according to the expanse in the part of the service of the base station, most of operations of the base stations are checked by an equipment like the base-station test unit, not by man. If there is provided an error to the base station, the base-station test unit generates and transmits an information signal to a central control center to thereby inform the present situation in the base station.

Figure 3:
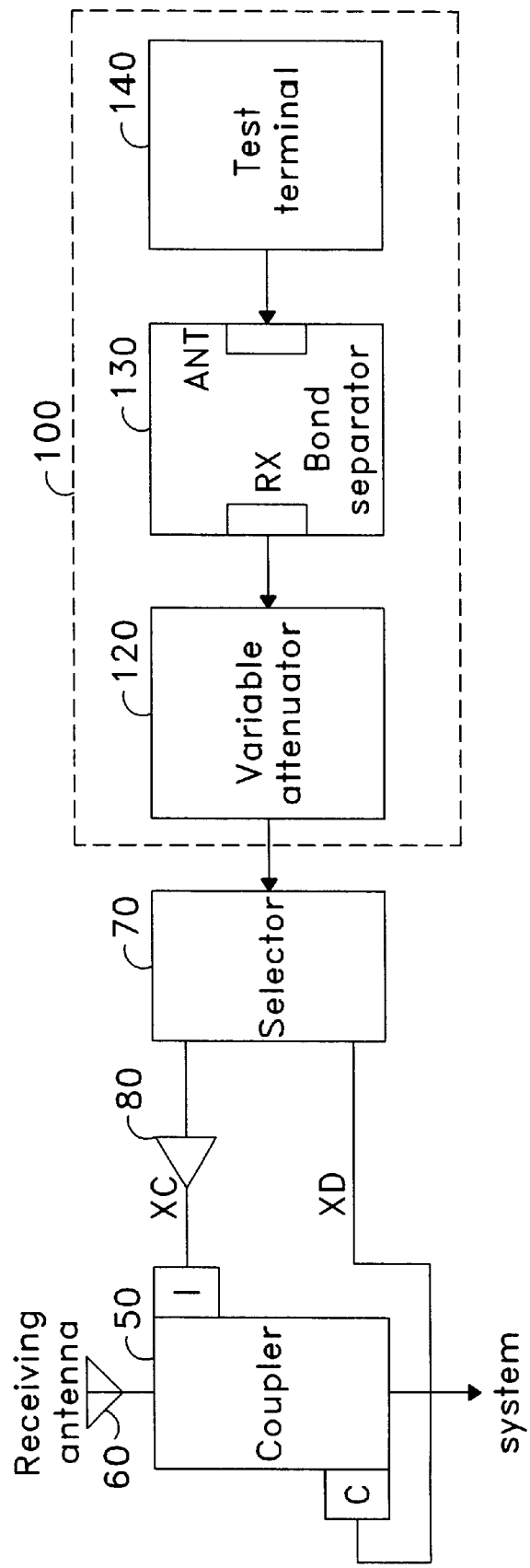
FIG. 3 is an embodiment of a voltage standing wave ratio measurement apparatus in a receiving terminal of the base station according to the present invention.

FIG. 3 is an embodiment of a voltage standing wave ratio measurement apparatus in a receiving terminal of the base station according to the present invention. The construction of FIG. 3 is similar to that of FIG. 2. But, if necessary, an amplifier 80 can be further included between the reception coupler 50 and the reception selector 70.

Figure 6:
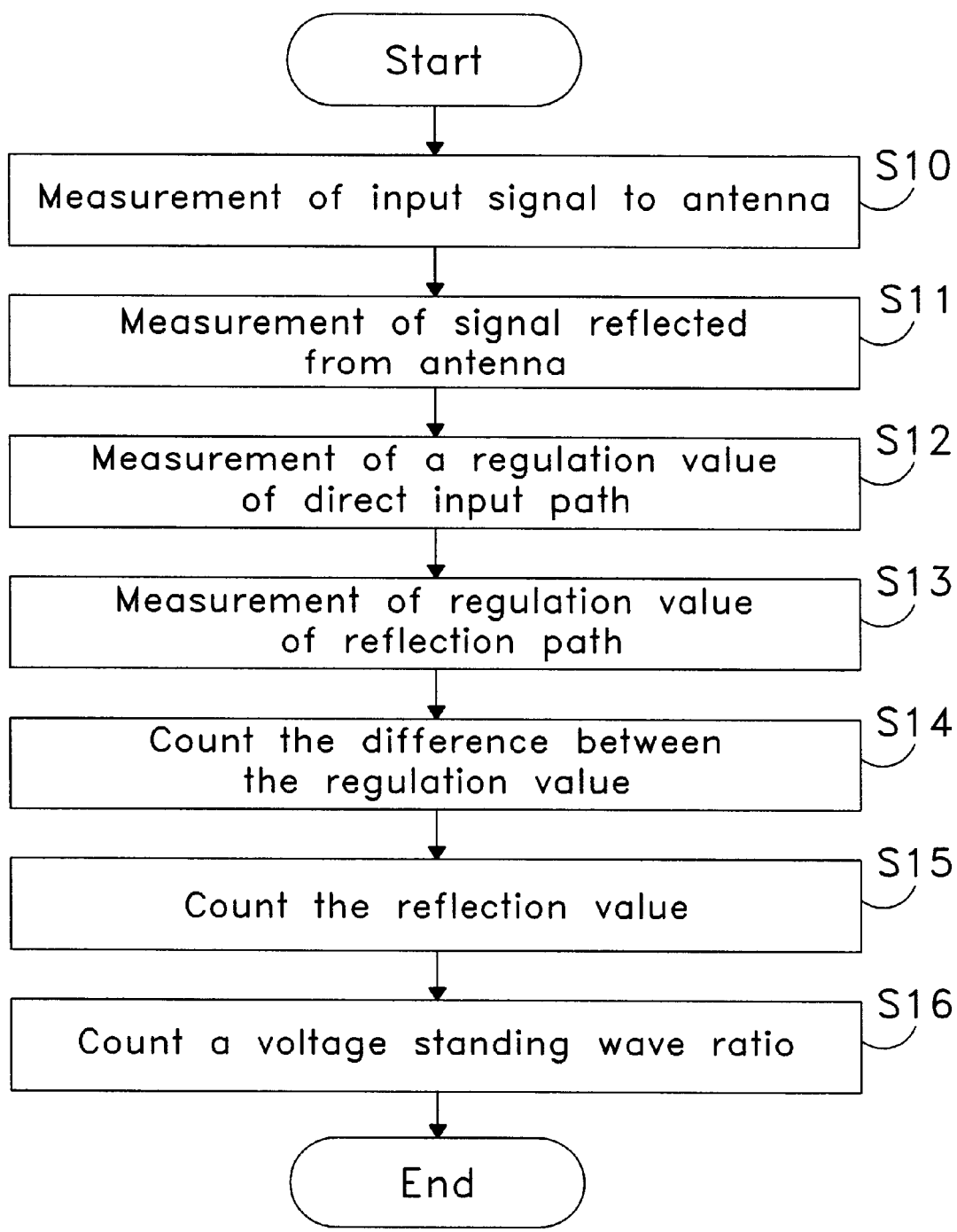
FIG. 6 is an operation flow of a voltage standing wave ratio measurement method in a receiving terminal according to the present invention.

As mentioned in FIG. 6, the method for measuring the voltage standing wave ratio in the receiving terminal according to the embodiment of the present invention, comprises the steps of measuring the power of an input signal from the antenna S10, measuring the power of a reflection signal reflected in the antenna S11, measuring a power regulation value of the direct input path S12, measuring a power regulation value of the reflection input path S13, counting the difference between the power regulation values S14, obtaining the reflection coefficient ($\tau$) and obtaining the voltage standing wave ratio VSWR S15 from the receiving terminal.

Figure 7:
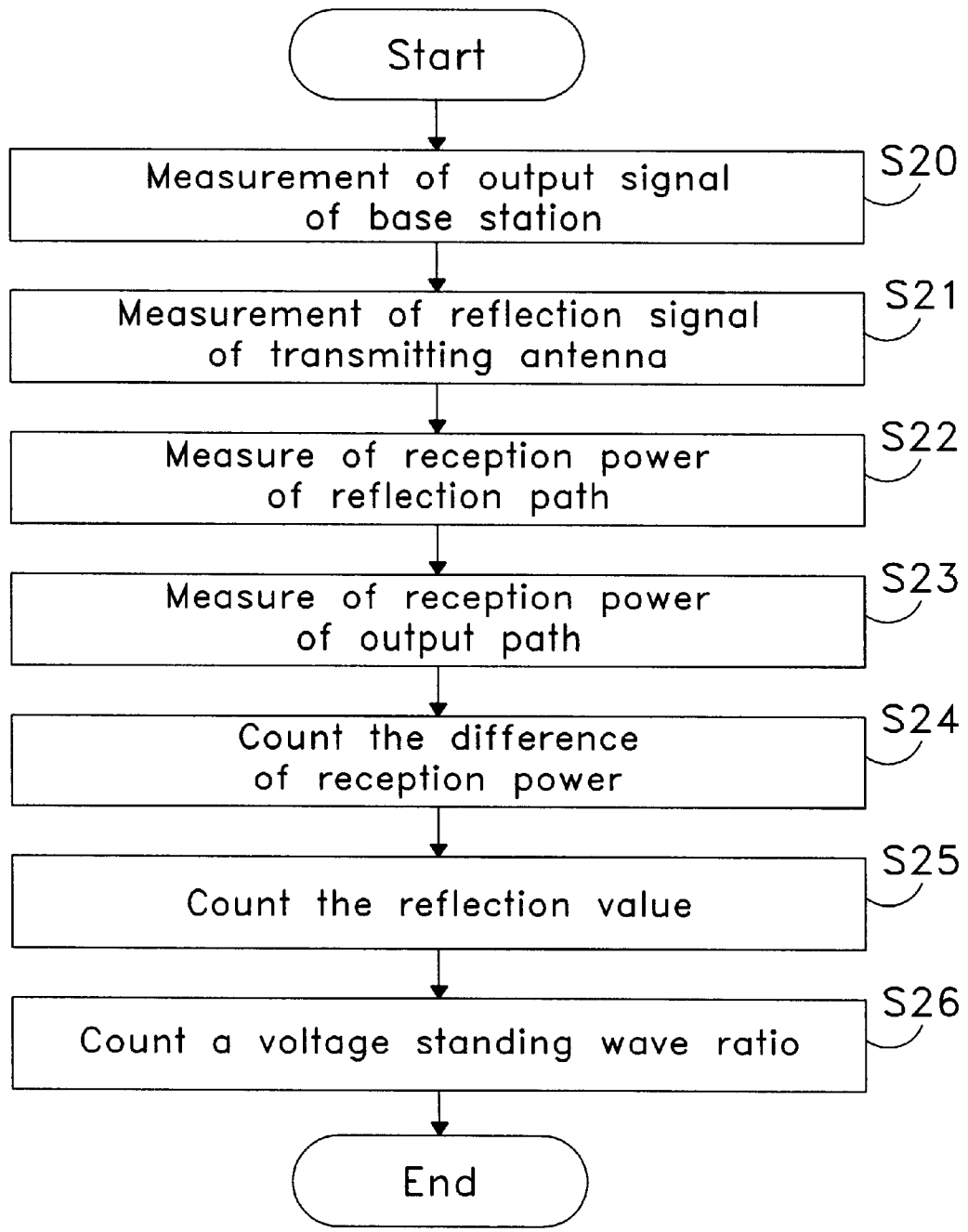
FIG. 7 is an operation flow of a voltage standing wave ratio measurement method in a transmitting terminal according to the present invention.

As shown in FIG. 7, the method for measuring the voltage standing wave ratio in the transmitting terminal according to the embodiment of the present invention, comprises the steps of measuring an output signal of the base station S20, measuring the signal reflected in the transmitting antenna S21, measuring the reception power $P_{dBREV}$ of a terminal of the reflection path S22, measuring another reception power $P_{dBFWD}$ of a terminal of output path S23, counting the difference (Pd=$P_{dBREV}$-$P_{dBFWD}$) between the above reception powers S24, counting the reflection coefficient $\tau$ S25, and obtaining the voltage standing wave ratio (VSWR) from the transmitting terminal.

Referring to Figures, there will be explained hereinafter an operation and an operable relationship between the apparatus and method for measuring the voltage standing wave ratio by using the base-station test unit according to the embodiment of the present invention.

Figure 4:
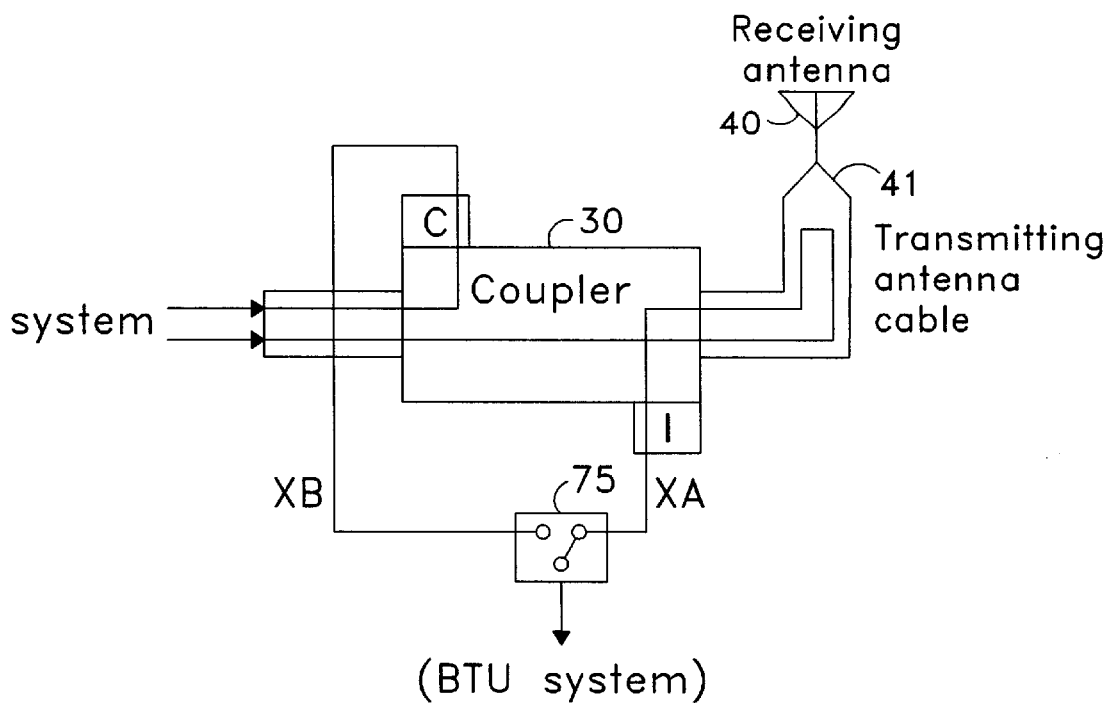
FIG. 4 is a detailed function block view of a voltage standing wave ratio measurement apparatus in a transmitting antenna according to the present invention.

FIG. 4 is a detailed function block view of the voltage standing wave ratio measurement apparatus in the transmitting antenna according to the present invention. In FIG. 4, there are provided the coupler 30, a transmitting antenna cable 41, a base-station test unit 100, and the transmitting antenna 40. Each signal of a direct coupling path and the reflection path is designed to be inputted to the base-station test unit 100. The input signal is attenuated by the coupling coefficient C. Further, the signal reflected in the antenna is also attenuated by the coupling coefficient.

As shown in FIGS. 2, and 4, the transmission coupler 30 outputs the direct signal XB and a reflection signal XA, the direct signal being generated by coupling an input signal from the base station, and the reflection signal being reflected in the antenna 40. As a switch being a STDT (Single Pole Double Through), the selector 75 selects both the reflection path and the direct input path of the transmission coupler 30 under control of the base-station test unit BTU 100. The transmission variable attenuator 110 of the base-station test unit 100 attenuates signals passed from both of the reflection path XA and the direct input path XB in order for a test terminal to measure it. The band separator 130 applies the signal to the test terminal 140.

At that time, the test terminal 140 counts a ratio between the direct path of the output signal of the base station and the reflection path reflected in the antenna to thereby measure the voltage standing wave ratio in the transmitting terminal.

As shown in FIG. 7, the method for measuring the voltage standing wave ratio in the transmitting terminal according to the present invention, is to switch the base-station test unit with the direct path XB of the coupler reception 30 under control of the selector 75. Here, the transmission output signal of the base station is attenuated by the coupling coefficient C, and then provided through the direct path XB. The power of the signal is calculated in the test terminal 140. Here, the signal is given as a power value $P_{dBFWD}$ of the direct input path.

Further, the base-station test unit 100 is connected to the transmission coupler 30 under control of the transmission selector 75. The output signal of the base station is reflected in the antenna and attenuated by the number of the couple coefficient C S21. The attenuated reflection signal is used for measuring the test terminal 140 S22, and then inputted to the base station 1, so that the base station can read the voltage standing wave ratio. The signal is described as the power value of the reflection path $P_{dBREV}$.

Therefore, the voltage standing wave ratio in the transmitting terminal can be calculated as follows.

$$Pd = P_{dBREV} - P_{dBFWD} \quad (1)$$

$$\tau = 10^{Pd/20} \quad (2)$$

$$VSWR = 1+\tau/1-\tau \quad (3)$$

As shown, the "$P_{dBREV}$" indicates the reception power of a terminal of the reflection path, the "$P_{dBFWD}$" the reception power of a terminal of the direct path, and "$\tau$" a reflection coefficient. That is, after the power values between the direct path and the reflection path are obtained, the reflection coefficient is obtained and the voltage standing wave ratio is measured.

In other words, the method for measuring the voltage standing wave ratio is to measure the output signals from the base station S20, to measure the reflection signal reflected in the antenna S21, to measure the reception power $P_{dBREV}$ of the terminal of the reflection path S22, and to measure the reception power $P_{dBFWD}$ of the terminal of the output path S23. Thereafter, the method is also to count the difference $Pd = P_{dBREV} - P_{dBFWD}$ between the reception powers of the terminals S24, count the reflection coefficient $\tau$ S25, and count the voltage standing wave ratio of the transmitting terminal S26.

In conclusion, under use of the general base-station test unit, the voltage standing wave ratio of the antenna of the base station can be measured. Also, under use of the hardware construction of the base-station test unit according to the prior art, the voltage standing wave ratio can be measured by the new measurement method, in addition to the checking and testing of the base station of the prior art.

Figure 5:
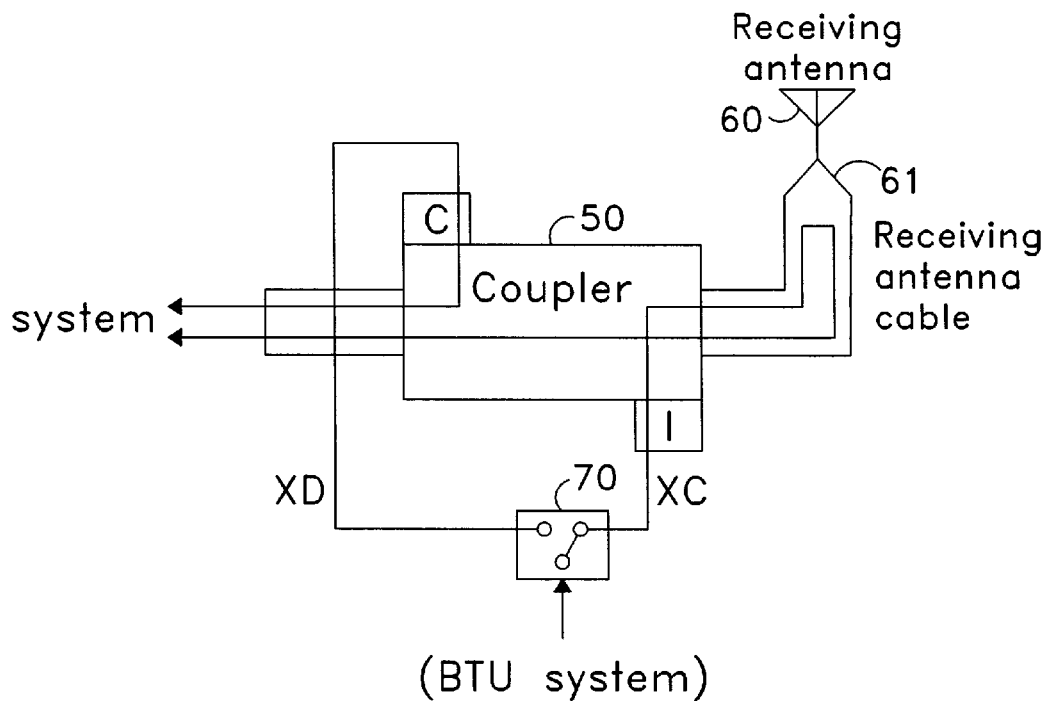
FIG. 5 is a detailed function block view of a voltage standing wave ratio measurement apparatus in a receiving antenna according to the present invention.

Referring to FIGS. 2, 5, and 6, there will be explained hereinafter the apparatus and method for measuring the voltage standing wave ratio in the receiving terminal.

The reception coupler 50 outputted a signal coupled with the coupling terminal through the direct input path to the base station and input signal from the indirect path, is outputted to the base station by being reflected in the receiving antenna 60. The SPDT switch selector 70 selects the indirect path and the direct path of the reception coupler 50 under control of the base-station test unit. The base-station test unit 100 applies the output of the test terminal to the reception selector 70 through the reception variable attenuator 120.

In more detailed, the voltage standing wave ratio measurement of the receiving antenna can be performed by both of the level of the input signal from the receiving antenna and the size of the signal reflected in the antenna. That is, the voltage standing wave ratio of the receiving antenna is measured by using closed loop power control functions between the base station and the mobile station (terminal). Further, the output to the terminal under control of the closed loop power is regulated as follows.

The transmission output of the terminal=$-73-P_{RX}+G_{ADJ}$(dBm) (4).

The "$P_{RX}$" indicates the reception power of the terminal, and is related to an open loop power control. The "$G_{ADJ}$" indicates a transmission regulation value of the terminal and is related to the closed loop power control.

A correction operation cannot be performed by the open loop power control because a value detected by the open loop power control is feed back to the input terminal of a control unit, even if the value is detected. But, through the closed loop power control, the amount of the control is detected and the detected value is feed back to the control unit to thereby perform the correction operation. The closed loop power control is a control system for according the amount of the control with an object value. The reception output regulation value of the terminal is obtained by analyzing a transmission signal of the transmission terminal and by transmitting the digital power control signal. The reception output regulation value of the terminal is determined depending upon the characteristic of the reception path of the terminal. In other words, the value is measured by comparing the digital power control regulation values of the terminal under use both of the direct input path and the reflection path of the antenna, and by calculating the compared value as a voltage standing wave ratio of the antenna.

In more detailed, in the voltage standing wave ratio measurement method in the receiving terminal, the power control setting value of the transmission path is regulated to dispose the reception power of the terminal in a proper location thereof. Then, after switching the receiving path with the direct path XD of the coupler 50 for a receiving antenna, the method is to transmit it to the test terminal 140. This is called a Marcov call. The power regulation value of the test terminal 140 is an optional value obtained from a preset table. The signal can be calculated as a transmission power of the test terminal 140. As an optional value selected by a user, the calculated signal is provided to the receiving antenna by the test terminal.

As a reception selector, the SPDT is connected to the indirect path of the reception coupler 50 under control of the base-station test unit. The obtained second power regulation value of the test terminal is regulated by the loss reflected in the receiving antenna from the signal of the test terminal. The power of the obtained second power regulation value of the test terminal is regulated by the power control signal of the base station. In general, the second power regulation value is larger than the first power regulation value by any one value in which its loss is compensated.

The voltage standing wave ratio in the receiving terminal can be calculated as follows:

$$Ad = A_{ADJFWD} - A_{ADJREV} \tag{5}$$

$$\tau = 10^{Ad/20} \tag{6}$$

$$VSWR = 1 + \tau / 1 - \tau \tag{7}$$

As the first power regulation value, the "$A_{ADJFWD}$" is a transmission regulation value of the direct input path. As the second power regulation value, the "$A_{ADJREV}$" is a transmission regulation value of the terminal in which the loss is compensated. The "$\tau$" is a reflection coefficient. The voltage standing wave ratio is measured by obtaining the first and second power regulation values and by counting the reflection coefficient.

In other words, as shown in FIG. 6, the voltage standing wave ratio is measured by detecting the direct signal inputted from the receiving antenna 60, S10, measuring the signal reflected in the receiving antenna 60, S11, measuring the power regulation value $A_{ADJFWD}$ of the direct input path S12, and measuring the power regulation value $A_{ADJREV}$ of the reflection path S13. Then, the difference between the power regulation values $Ad = A_{ADJFWD} - A_{ADJREV}$ is counted S14 and the reflection coefficient $\tau$ is obtained S15. So that the voltage standing wave ratio of receiving terminal can be obtained S16.

FIG. 3 is the embodiment of the voltage standing wave ratio measurement apparatus in the receiving terminal of the base station according to the present invention. In FIG. 3, there are provided the reception coupler 50, the receiving antenna 60, an amplifier 80 for amplifying a signal generated from the test terminal located between the reception coupler 50 and the reception selector, a variable attenuator 120 for adjusting the loss which can occur between the transmission path and the reception path, a band separator 130 for separating the band of the direction of the transmission and reception thereof, and the test terminal 140. Even though the coupler 50 and the receiving antenna 60 are separated from each other, there is no problem in that the voltage standing wave ratio is measured.

FIG. 5 is a detailed function block view of the voltage standing wave ratio measurement apparatus in the receiving antenna according to the present invention. In FIG. 5, there are provided the coupler 50, a receiving antenna cable 61, the base-station test unit 100, and the receiving antenna 60. The SPDT switch in the construction of FIG. 2 is connected to the reception selector 70. The signal of the direct coupling path and the reflection path is outputted from the base-station test unit 100. The signal inputted from the direct couple path is attenuated by the number of the couple coefficient C and is outputted to an input terminal of the receiving/transmitting system. On the other hand, the signal from the indirect path is attenuated by the number of the coupling coefficient C and is applied to the input terminal of the base station after being reflected in the antenna.

According to the present invention, under use of one base-station test unit, the voltage standing wave ratio in the transmitting and receiving terminals can measured at the same time. Here, the voltage standing wave ratio measurement is implemented by using a mobile phone which is used for the test terminal.

As mentioned above, in the voltage standing wave ratio measurement method having the amplifier coupled between the coupler 50 and the selector 70, the reception power of the terminal adjusts the setting value of a transmitting path regulator to be disposed at the proper location to the terminal. After switching the reception path of the selector 70 with the direct path of the reception coupler 50, the transmission operation begins by means of the test terminal 140.

Under use of such a signal, the transmission power of the test terminal is calculated. The calculated value is called a first power regulation value and is selected by the user. As a reception selector 70, the SPDT switch is connected to the indirect path XC of the coupler, and the second power regulation value is obtained therefrom. The second power regulation value is reflected in the antenna, and is then regulated by the power control signal.

The second power regulation value is larger than the first power regulation value.

At this time, the voltage standing wave ratio through the amplifying operation in the amplifier 80 is calculated as follows:

$$Ad = A_{ADJFWD} - A_{ADJREV} + G_{AMP} \tag{8}$$

$$\tau = 10^{Ad/20} \tag{9}$$

$$VSWR = 1 + \tau / 1 - \tau \tag{10}$$

where, the "$A_{ADJFWD}$" indicates the transmission power regulation value of the direct input path, the "$A_{ADJREV}$" the transmission power regulation value of the reflection path, and "$\tau$" is a reflection coefficient. The $G_{AMP}$ is the gain of the amplifier 80 and the gain of amplifier 80 is set to two times as large as the loss of the cable. Since the cable has constant loss corresponding to length, the loss can be easily calculated by the specification characteristic provided by its manufacturer.

The voltage standing wave ratio in the receiving terminal can be obtained by measuring the signal reflected in the antenna, measuring the power regulation value of the direct input path, and measuring the power regulation value of the reflection path. Then, the ratio is measured by counting the difference between the power regulation values and counting the reflection coefficient.

Under such a construction mentioned above, the service provider (for example, a first mobile communication worker, a second mobile communication worker, and a PCS worker) accurately measures the voltage standing wave ratio by confirming whether there is any error in the presence/absence of the system antenna, without stopping the present service or call to be made.

In other words, the present invention is capable of measuring the voltage standing wave ratio of the system without affecting the operation of the system during its operation.

Especially, the regulation value used for regulating the gain of the terminal is capable of calculating the voltage standing wave ratio. Further, the regulation value is capable of measuring the voltage standing wave ratio without changing the hardware of the base-station test unit.

The voltage standing wave ratio in the transmitting antenna is similar to that of the prior art. However, there is a little difference from the voltage standing wave ratio of the present invention in that it is measured by using a specific value of the terminal having the base-station test unit BTU.

Through the above method, the service provider or the PCS provider can check if there is any error in the antenna of the base station, without stopping their service.

Thus, there is an efficiency in the present invention in that the voltage standing wave ratio can be measured without cutting the call, allowing the basic function of the base station to be maintained. Further, according to the present invention, there is another efficiency in that the characteristic of the voltage standing wave ratio is measured by reducing noise.

The apparatus and method according to present invention is capable of expending the measurement part of the voltage standing wave ratio in the receiving antenna by using the amplifier between the reception coupler and the reception selector. The apparatus and method of the present invention is capable of measuring the voltage standing wave ratio in the receiving terminal, regardless of the length of the cable located between the reception coupler and the receiving antenna. The method of the present invention is implemented by using the base-station test unit which is used for checking the presence/absence of the antenna of the base station with low expenses.

In addition, there is the other efficiency in the apparatus and method of the present invention in that the voltage standing wave ratio is selectively or independently measured in the transmitting and the receiving terminals depending upon user's need. It will be apparent to those skilled in the art that various modifications and variations can be made in the apparatus and method for measuring the voltage standing wave ratio of the present invention without departing from the spirit or scope of the invention. Thus, it is intended that the present invention cover the modifications and variations of this invention provided they come within the scope of the appended claims and their equivalents.

What is claimed is:

1. An apparatus for measuring a voltage standing wave ratio of a base station, comprising:
    a transmission voltage standing wave ratio (VSWR) measuring unit, coupled between a transmission terminal of a base station and a transmitting antenna, and configured to receive an input signal from the base station and couple a prescribed portion of a transmission power of the input signal, and compare a difference between said coupled signal and a signal reflected from the transmitting antenna to determine a transmission VSWR; and
    a reception VSWR measuring unit coupled between a receiving terminal of the base station and a receiving antenna, and configured to receive a test signal from a base station test unit and determine a reception VSWR of the receiving terminal by comparing the test signal to a signal reflected from the receiving antenna, wherein the transmission VSWR and the reception VSWR can be measured simultaneously.

2. The apparatus of claim 1, further comprising a coupler coupled to receive for outputting said input signal from said base station and said reflected signal, and a selector for selecting any one of said output signals.

3. The apparatus of claim 2, further comprising a variable attenuator for attenuating signals selected by said selector.

4. The apparatus of claim 1, further comprising:
    a coupler configured to receive and output the test signal from the base station test unit and the signal reflected from the receiving antenna, and
    a selector configured to selectively couple the test signal to one of a first and second port of the coupler.

5. The apparatus of claim 4, further comprising a variable attenuator for attenuating signals selected by said selector.

6. The apparatus of claim 4, further comprising an amplifier coupled to the selector and the coupler for compensating a transmission loss of the test signal.

7. The apparatus of claim 1, wherein the base station test unit is coupled to the transmission and reception VSWR measuring units, and wherein the base station test unit controls each of the transmission and reception VSWR measuring units.

8. The apparatus of claim 7, wherein the base station test unit comprises a test terminal, a band separator, and a variable attenuator, and wherein the test terminal calculates the VSWR for the transmitting antenna and the receiving antenna, and the band separator is coupled to the test terminal to separate transmission signals and reception signals.

9. The apparatus of claim 8, wherein the test terminal further transmits a state of the base station to a remote location, wherein the state of the base station is determined based on the voltage standing wave ratios.

10. The apparatus of a claim 1, wherein the VSWR of the transmitting terminal and the receiving terminal are measured while the transmitting terminal and receiving terminal are transmitting and receiving, respectively.

11. An apparatus for measuring a voltage standing wave ratio (VSWR) of a transmitting terminal, comprising:
    a first coupler coupled to a first terminal of a base station and a transmitting antenna, and configured to receive and output a direct path signal from a base station and a reflected signal from a transmitting antenna;
    a first selector coupled to the first coupler, and configured to select at least one of the direct path signal and the reflected signal; and
    a test unit coupled to the selector to measure a power of the direct path signal and a power of the reflected signal, wherein the test unit determines the VSWR using the power of the direct path signal, the power of the reflected signal, and a reflection coefficient, and wherein the test unit generates and transmits an information signal to communicate a present state of the base station.

12. The apparatus of claim 11, further comprising a first variable attenuator for attenuating signals selected by said first selector.

13. The apparatus of claim 11, further comprising:
    a second coupler coupled to a second terminal of the base station, a receiving antenna, and the test unit, and configured to output a signal from the test unit and a signal reflected from the receiving antenna; and
    a second selector to selectively couple the signal from the test unit to one of a first and second port of the second coupler.

14. The apparatus of claim 13, wherein the test unit comprises:
    a test terminal configured to generate a test signal;
    a band separator coupled to the test terminal to separate transmission signals and reception signals;
    a first variable attenuator configured to couple the first selector to the band selector; and
    a second variable attenuator configured to couple the second selector to the test terminal.

15. The apparatus of claim 11, wherein the test unit transmits the information signal to a remote location.

16. The apparatus of claim 11, wherein the test unit comprises an attenuator coupled to receive an output of the first selector, a band separator coupled to receive an output of the attenuator, and a test terminal coupled to receive an output of the band separator.

17. The apparatus of claim 16, wherein the test unit is further coupled to a receiving unit, and wherein the band separator separates transmission signals from reception signals.

18. An apparatus for measuring a voltage standing wave ratio (VSWR) of a receiving terminal, comprising:
   a coupler coupled to a receiving terminal of a base station, a base station test unit, and a receiving antenna, and configured to receive and output a test signal from the base station test unit and a signal reflected from the receiving antenna; and
   a selector to selectively couple the signal from the base station test unit to one of a first and second port of the coupler, wherein the signal from the base station test unit is a direct path signal for the receiving antenna to compare to the reflected signal to determine the VSWR.

19. The apparatus of claim 18, further comprising a variable attenuator coupled between the base station test unit and the coupler.

20. The apparatus of claim 19, further comprising an amplifier coupled between the selector and the first port of the coupler to compensate a transmission loss of a transmission output from the base station test unit.

21. The apparatus of claim 18, wherein the base station test unit comprises a test terminal to generate the test signal, a band separator to receive the test signal and separate it from a transmission signal, and an attenuator coupled to the band separator to attenuate the test signal and forward it to the selector.

22. The apparatus of claim 21, wherein the test unit is further coupled to a transmitting terminal of the base station, and wherein the test terminal controls a measurement of the VSWR.

23. A method for measuring a voltage standing wave ratio (VSWR) of a base station, comprising:
   obtaining a VSWR of a transmitting terminal by comparing a difference between an input signal from said base station and a signal reflected from a transmitting antenna; and
   obtaining a VSWR of a receiving terminal by comparing a difference between an input signal from a base-station test unit and a signal reflected from a receiving antenna, wherein each of the transmitting and receiving VSWRs can be obtained while the base station is active.

24. The method of claim 23, further comprising:
   receiving the input signal from said base station through a coupler and outputting the input signal to a selector;
   receiving the signal reflected from said transmitting antenna through the coupler and outputting the reflected signal to the selector;
   selectively outputting each signal outputted from said coupler to the base-station test unit;
   measuring a power of the signals outputted from the coupler with a test terminal of the base station; and
   obtaining the VSWR using a difference between the test unit power of each signal.

25. The method of claim 24, further comprising attenuating said signal selected by said selector.

26. The method of claim 23, further comprising:
   generating a test signal by a test terminal of the base station test unit;
   providing the test signal to a coupler in accordance with a control of the base station test unit to obtain a direct coupled signal;
   receiving by the coupler a reflection signal reflected from the receiving antenna; and
   obtaining the VSWR using a difference between the direct coupled signal and the reflection signal.

27. The method of claim 26, further comprising amplifying an output of the test terminal to compensate a transmission loss of the test signal from the test terminal.

28. The method of claim 23, wherein the steps of measuring the voltage standing wave ratio of the transmitting terminal and the step of obtaining the voltage standing wave ratio of the receiving terminal are performed by a single test unit.

29. The method of claim 28, wherein a band separator of the test unit separates the transmission signal from the receiving signal.

30. The method of claim 23, wherein the voltage standing wave ratio of the transmitting terminal is measured while the system is transmitting, and the voltage standing wave ratio of the receiving terminal is obtained while the system is receiving.

31. A method for measuring a voltage standing wave ratio of a transmitting terminal, comprising:
   coupling an input signal from a base station and a signal reflected from a transmitting antenna through a coupler;
   selectively outputting the coupled input signal and reflected signal from the coupler under control of a base-station test unit;
   receiving the selected output in a test terminal of the base station test unit and measuring reception power of the coupled input signal and the signal reflected from the transmitting antenna; and
   obtaining the voltage standing wave ratio by determining a difference between the reception powers.

32. The method of claim 31, further comprising attenuating the signal outputted from the coupler.

33. The method of claim 31, wherein the steps of measuring reception power and obtaining the voltage standing wave ratio are performed while the transmitting terminal is in operation.

34. A method for measuring a voltage standing wave ratio of a receiving terminal, comprising:
   generating a test signal in a base-station test unit, and providing the test signal to a coupler under control of the base station test unit to obtain a coupled direct signal;
   receiving by the coupler a reflection signal reflected from a receiving antenna; and
   obtaining the voltage standing wave ratio of the receiving terminal by determining a difference between the coupled direct signal and the reflection signal.

35. The method of claim 34, further comprising amplifying the test signal to compensate a transmission loss of the test signal.

36. A base-station test terminal, comprising:
   a test terminal to receive transmission signals from a transmitter and generate test signals for a receiver; and
   a band separator, coupled to the test terminal to selectively receive one of a direct transmission signal from a transmitting terminal of a base station and a reflected transmission signal from a transmitting antenna, and to output the test signal from the test terminal to a coupler that couples a receiving antenna to a receiving terminal of the base station, wherein the test terminal determines a transmission voltage standing wave ratio in accordance with the received transmission signals, and generates the test signal in order to determine a reception voltage standing wave ratio.

37. An apparatus for measuring a voltage standing wave ratio (VSWR) of a base station, comprising:

a transmission antenna;

a first coupler, coupled to the transmission antenna and the base station to generate a first direct path signal and a first reflection path signal from a transmitting signal;

a receiving antenna;

a second coupler, coupled to the receiving antenna and the base station to receive a second direct path signal from a base station test terminal and a second reflection path signal from a reception signal; and a test unit having the base station test terminal, wherein the test unit is configured to measure a VSWR of the transmitting antenna by comparing the first direct path signal to the first reflection path signal, and wherein a VSWR of the receiving antenna is determined by comparing the second direct path signal to the second reflection path signal.

38. The apparatus of claim 37, further comprising a transmitting selector coupled between the first coupler and the test unit, a receiving selector coupled between the second coupler and the test unit, a transmitting variable attenuator coupled to receive an output of the transmitting selector, a receiving variable attenuator coupled to receive an output of the receiving selector, and a band separator coupled between each of the variable attenuators and the base station test terminal.

39. The apparatus of claim 37, wherein the first coupler outputs the first reflection path signal through an isolation terminal and outputs a coupled part of a transmission signal as the first direct path signal through a coupling terminal.

40. The apparatus of claim 37, wherein the second coupler inputs the signals from the base station test unit selector to the isolation terminal, and outputs signals reflected from the receiving antenna, and inputs the signals from the base station test unit selector into the coupling terminal and outputs to the system.

41. An apparatus for measuring a voltage standing wave ratio of a transmitting terminal, comprising:

a first coupler to receive and output a first signal from a first signal source and a second signal reflected from a first antenna;

a first selector coupled to the first coupler to select at least one of the output signals from the first coupler; and a band separator, coupled to the first selector to selectively receive one of an output signal from the first selector and a third signal from a second signal source to determine a voltage standing wave ratio based on an analysis of the signals.

42. The apparatus of claim 41, further comprising a second selector coupled to the band separator to receive and select at least one of a test signal and the third signal from the band separator, a second coupler coupled to the second selector to receive an output one of second selector, wherein the third signal is a reflected signal from a second antenna.

43. The apparatus of claim 42, further comprising a test terminal coupled to the band selector, wherein the first signal is a transmission signal, the first signal source is the base station, the first antenna is a transmitting antenna, and the second signal is a reflected portion of the first signal, and wherein the second antenna is a receiving antenna, and the test terminal generates the test signal.

* * * * *